(12) United States Patent
Griffith et al.

(10) Patent No.: US 6,680,653 B2
(45) Date of Patent: Jan. 20, 2004

(54) VCO TUNING CURVE COMPENSATED CHARGE PUMP CURRENT SYNTHESIZER

(75) Inventors: Scott A. Griffith, San Clemente, CA (US); Trang N. Trinh, Cypress, CA (US); Pete Good, Dana Point, CA (US)

(73) Assignee: Skyworks Solutions, Inc., Newport Beach, CA (US)

( * ) Notice: Subject to any disclaimer, the term of this patent is extended or adjusted under 35 U.S.C. 154(b) by 0 days.

(21) Appl. No.: 09/742,256

(22) Filed: Dec. 20, 2000

(65) Prior Publication Data

US 2002/0039050 A1 Apr. 4, 2002

Related U.S. Application Data

(63) Continuation-in-part of application No. 09/675,889, filed on Sep. 29, 2000, now abandoned.

(51) Int. Cl.[7] .................................................. H03L 7/00
(52) U.S. Cl. ........................ 331/17; 331/1 A; 327/156; 327/157; 327/159; 375/326; 455/260
(58) Field of Search ................... 331/17, 1 A; 327/156, 327/157, 159; 375/376; 455/260

(56) References Cited

U.S. PATENT DOCUMENTS

| | | | | |
|---|---|---|---|---|
| 5,126,692 A | * | 6/1992 | Shearer et al. ................. | 331/8 |
| 5,334,953 A | * | 8/1994 | Mijuskovic .................... | 331/8 |
| 5,475,326 A | * | 12/1995 | Masuda ....................... | 327/157 |
| 6,377,091 B1 | * | 4/2002 | Williams et al. ............ | 327/156 |

* cited by examiner

*Primary Examiner*—Arnold Kinkead

(57) ABSTRACT

A system provided for controlling an output frequency of a voltage controlled oscillator relative to a reference frequency. A method includes the steps of detecting a phase error between a divided output of the voltage controlled oscillator and the reference frequency, pumping a frequency control input of the voltage controlled oscillator with the phase error and adjusting a pumping gain based upon a magnitude of the frequency control input to the voltage controlled oscillator.

This apparatus includes a phase detector adapted to detect the phase error between the divided output of the voltage controlled oscilator and the reference frequency and a charge pump adapted to pump the frequency control input of the voltage controlled oscillator with the phase error. The apparatus also includes a gain controller adapted to adjust the pumping gain based upon the magnitude of the frequency control input to the voltage controlled oscillator.

16 Claims, 4 Drawing Sheets

US 6,680,653 B2

VCO TUNING CURVE COMPENSATED CHARGE PUMP CURRENT SYNTHESIZER

This application is a continuation-in-part of U.S. application Ser. No. 09/675,889 filed on Sep. 29, 2000 (now abandoned)

BACKGROUND OF THE INVENTION

1. Field of the Invention

The field of the invention relates to oscillators and more particularly to voltage controlled oscillators.

2. Related Art

Voltage controlled oscillators (VCOs) are known and are frequently used in radio frequency transceivers for upconverting an information signal from baseband to a particular transmission frequency (i.e., channel) or for downconverting an information signal from a particular transmission channel to baseband.

VCOs typically operate based upon the use of tank circuits and upon the influence of a variable capacitance provided by a varactor. As is well known, tank circuits are devices that resonate at frequencies determined by inductive and capacitive elements. Changing the values of the inductive or capacitive elements changes the resonant frequency of the tank circuit, thereby changing the output frequency of a VCO relying upon the tank circuit.

The varactor of a VCO may be a diode or some other similar device. As is known, the capacitance across some diodes changes as a function of a reverse-bias voltage. Where the reverse-biased diode is connected to an inductor, the resonant frequency of the tank circuit can be independently controlled by the voltage across the diode.

While VCOs are effective, low voltage VCO designs, relying upon on-chip varactor diodes, typically suffer from performance impediments such as frequency centering errors and large variations in tuning constants. Frequency centering errors can be reduced by providing a large tuning sensitivity range, but this can contribute to phase noise. Because of the importance of VCOs in communications, a need exists for a better method of improving the tuning linearity and centering frequency error of VCOs.

SUMMARY

This invention provides for controlling an output frequency of a voltage controlled oscillator relative to a reference frequency. The method includes the steps of detecting a phase error between a divided output of the voltage controlled oscillator and the reference frequency, pumping a frequency control input of the voltage controlled oscillator with the phase error and adjusting a pumping gain based upon a magnitude of the frequency control input to the voltage controlled oscillator.

The apparatus includes a phase detector adapted to detect the phase error between the divided output of the voltage controlled oscillator and the reference frequency and a charge pump adapted to pump the frequency control input of the voltage controlled oscillator with a phase error. The apparatus also includes a gain controller adapted to adjust the pumping gain based upon the magnitude of the frequency control input to the voltage controlled oscillator.

Other systems, methods, features and advantages of the invention will be or will become apparent to one of skill in the art upon examination of the following figures and detailed description. It is intended that all such additional systems, methods, features and advantages be included within this description, be within the scope of the invention, and be protected by the accompanying claims.

BRIEF DESCRIPTION OF THE FIGURES

The invention can be better understood with reference to the following figures. The components in the figures are not necessarily to scale, emphasis instead being placed upon illustrating the principals of the invention. Moreover, in the figures, like reference numerals designate corresponding parts throughout the different views.

DETAILED DESCRIPTION OF A PREFERRED EMBODIMENT

Figure 1:
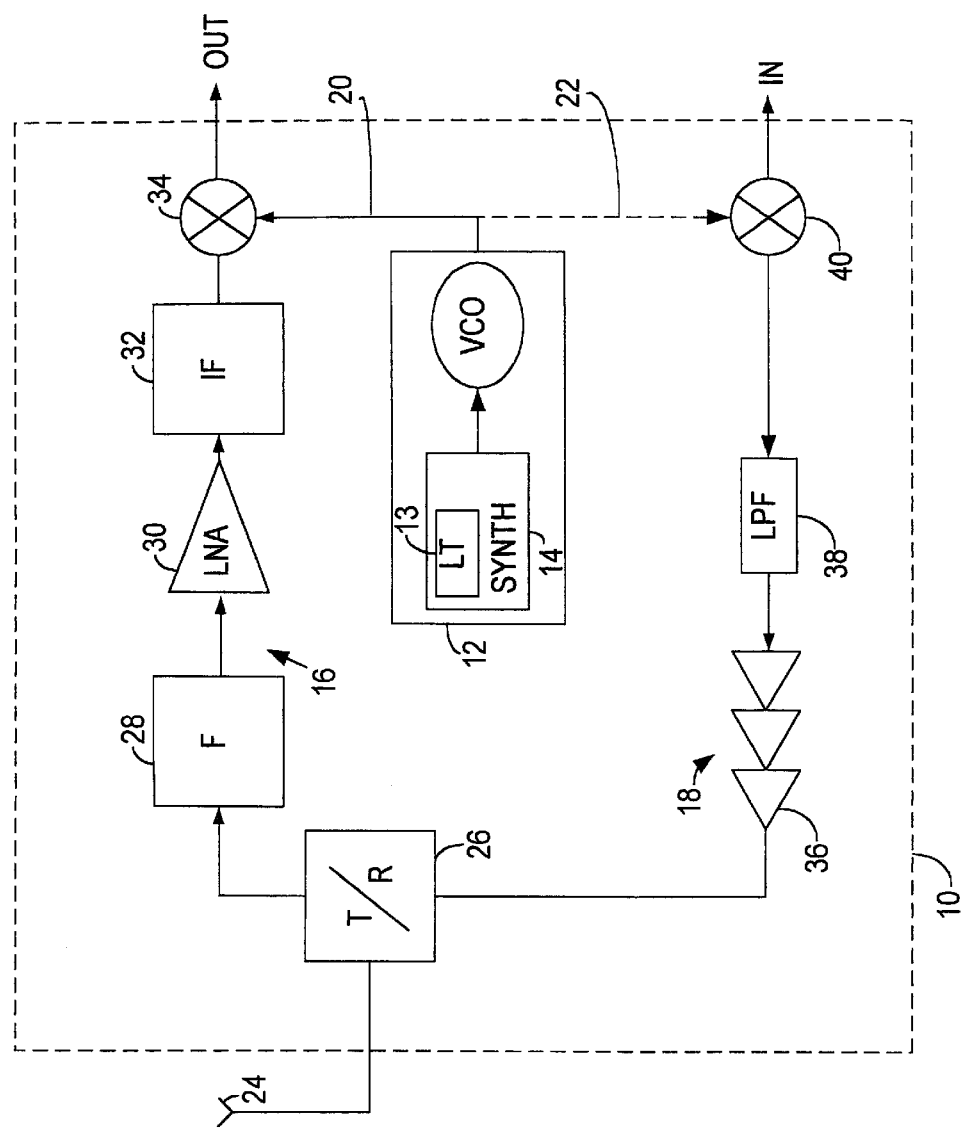
FIG. 1 is a block diagram of a voltage controlled oscillator system shown.

FIG. 1 shows a dual input voltage controlled oscillator (VCO) system 12 in a context of use under an illustrated embodiment of the invention. As shown, the VCO system 12 is depicted within a simplified radio frequency (RF) transceiver 10. Within the RF transceiver 10, the VCO system 12 may provide a variable frequency oscillator signal that may be used for frequency translation of an information signal between baseband and a transmit frequency and/or between a receive frequency and baseband.

Within the VCO system 12, a frequency control (i.e., a channel selector) 14 may be used to select a non-coincidental transmit and receive frequency to be used for frequency translation. In a first, receive state, the VCO system 12 provides the receive frequency through a first output 20 to a receiver 16. In a second, transmission state, the VCO system 12 provides a transmit frequency through a second output 22.

Within a receiver portion 16 of the transceiver 10, a signal from the antenna 24 may pass through a transmit/receive switch 26 and be band pass filtered in a first filter 28. The filtered signal may be amplified in an amplifier 30. Following amplification, signal images may be removed within an imaging filter 32. Following bandpass filtering, amplification and image filtering, the information signal may be mixed with the receive frequency from the VCO system 12 in a first mixer 34 and reduced to baseband.

In a transmitter 18 an information signal "IN" is mixed with a transmit signal from the VCO system 12 in a second mixer 40. The mixed signal may be low-pass filtered in a low-pass filter 38. The filtered signal may be amplified in a power amplifier 36 and routed through the transmit/receive switch 26 for transmission through the antenna 24.

Figure 2:
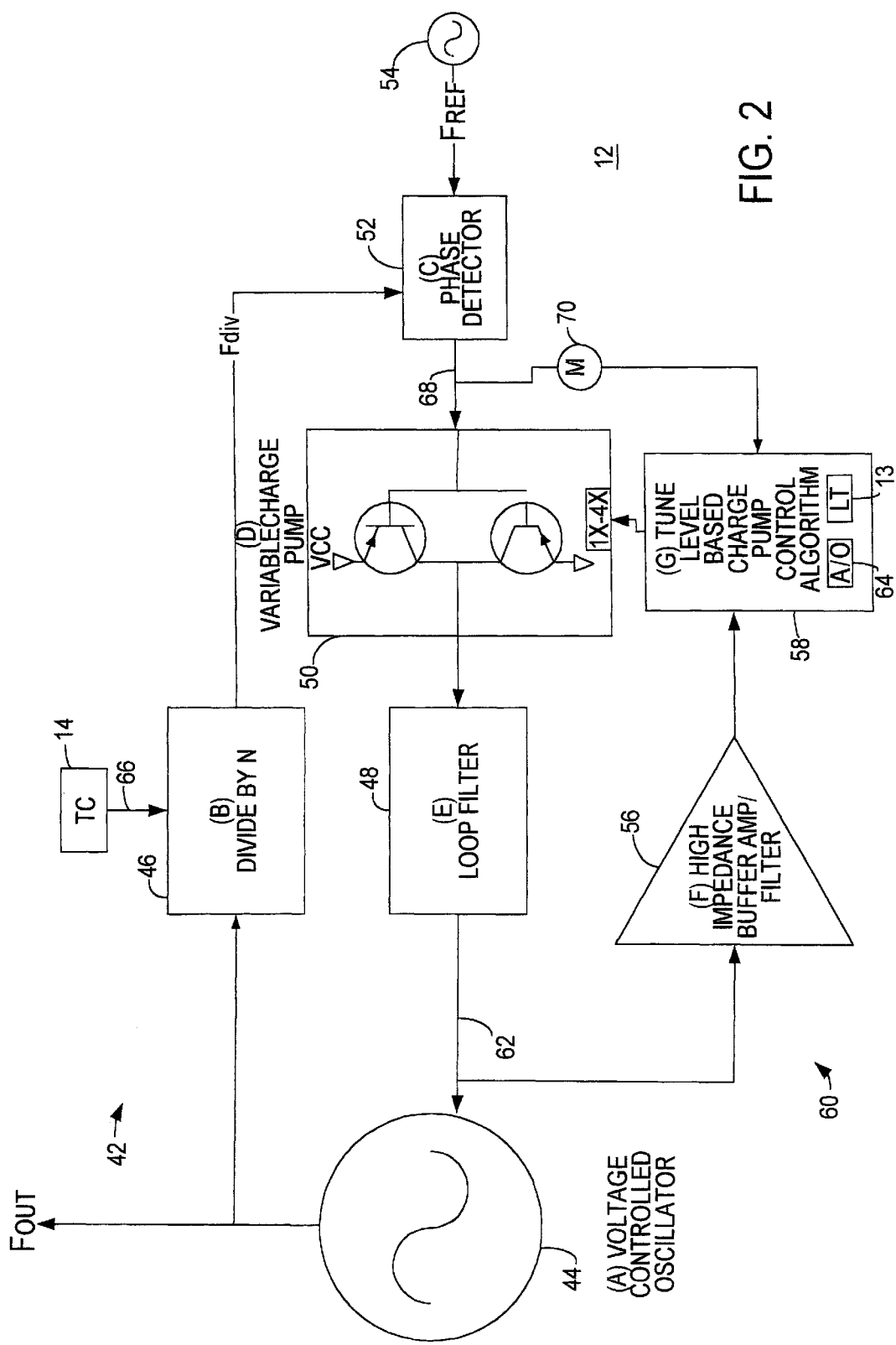
FIG. 2 is a block diagram of the voltage controlled oscillator system of FIG. 1.

FIG. 2 is a block diagram of the VCO systems 12 of FIG. 1. The VCO system 12 may be fabricated on a single integrated circuit chip using conventional techniques. Included within the VCO system 12 may be a VCO 44. Primary control of the operating frequency of the VCO 44 of the VCO system 12 may be accomplished through the use of a phase locked loop (PLL) 42 and reference oscillator 54. An output from the reference oscillator 44 is compared with a divided output frequency $F_{div}$ from the VCO 44 in a phase detector 52. The output frequency from the VCO 44 may be divided to an appropriate comparison frequency for application to the detector 52 within a divider 46. The phase detector 52 may be any electronic device which compares a phase and/or a frequency of the divided output frequency $F_{div}$ with the reference frequency $F_{ref}$ and which provides a control signal(s) proportional to the phase and/or frequency error between the signals.

A tune control word 66 may be used to select a proper operating frequency for the output $F_{out}$ of the VCO system 12. The divider 46 may be conventional or a fractional frequency divider. The tune control word 66 functions as a divisor to divide the output frequency $F_{out}$ to the appropriate frequency $F_{div}$. By selecting an appropriate tune control word 66, the VCO 44 is caused to operate at whatever frequency necessary to closely match the divided frequency $F_{div}$ with the reference frequency $F_{ref}$.

From the phase detector 52, the phase difference may be provided as an input to a charge pump 50. The charge pump 50 functions to source or sink current under the control of the phase detector 52. The output of the charge pump 50 is provided as an input to a loop filter 48. The loop filter 48 may be any low pass filter which functions to integrate the pulsed current output of the charge pump 50.

To improve stability at any operating point, a feedback loop 60 is used to adjust a current gain of the charge pump 50. A feedback signal 62 from an output of the loop filter 48 provides an input to the feedback loop 60. The feedback signal 62 may be amplified within a high impedance buffer amplifier/filter 56 and provided as an input to a gain control processor 58. It should be noted that while the gain control processor 58 is shown as an independent module in FIG. 2, it could just as well be part of the frequency synthesizer control as shown in FIG. 1.

Within the gain control processor 58, a magnitude of the amplified feedback signal may be measured and used to select an appropriate current gain for charge pumping within the charge pump 50. The amplified feedback signal may first be converted into a digital feedback signal within an analog to digital (A/D) converter 64. The digital feedback signal may then be used as an index to enter a lookup table 13 within the gain control processor 58 for recovery of an appropriate gain control word. With the appropriate gain control word, charge pumping may be controlled to a level appropriate to the operating point of the VCO 44.

Figure 3:
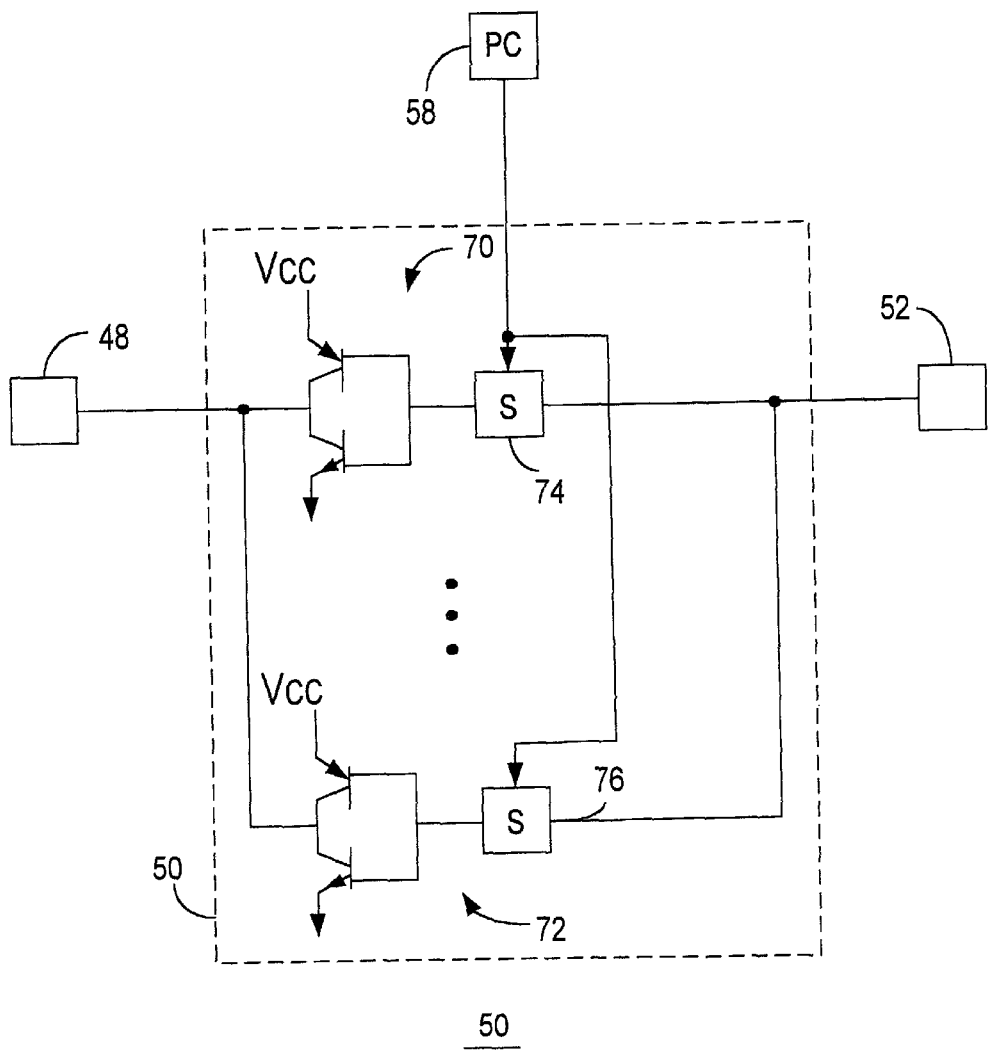
FIG. 3 is a schematic of a charge pumping system used by the oscillator system of FIG. 2.

FIG. 3 is a simplified schematic of the charge pump 50. Included within the charge pump 50 may be a number of pumping modules 70 and 72 connected in parallel. While two modules 70 and 72 are shown in FIG. 3, it is to be understood that any number of modules 70 and 72 may be used depending upon the granularity of gain control desired. Respective switches 74 and 76 function to control each pumping module (i.e., turn each module 70 and 72 on or off).

Under the simplified system of two modules 70 and 72 shown in FIG. 3, each module would sink or source 50% of the total current used to drive the VCO 44. Looking at the pump 50 of FIG. 3 from another point of view, if one module (e.g., 70) where pumping the VCO 44, then the activation of the second module 72 would result in a 100% increase in amplification.

In general, if a larger number of modules 70 and 72 were provided (e.g., 20), then each module 70 and 72 would contribute a smaller fraction (i.e., 5%) of the amplification of the signal driving the VCO 44. By judicially activating or deactivating the modules 70 and 72 (by operation of the switches 74 and 76) the current gain of the charge pump 50 may be precisely matched to the operating point of the VCO 44.

In order to control the VCO system 12 of FIG. 2, a calibration routine may be used to create the lookup table 13 used to selectively activate modules 70 and 72 on or off. As a first step, a tuning sensitivity $k_V$ may be determined for the VCO 44. The tuning sensitivity $k_V$ means the change in output frequency Fout for every one-volt change in the feedback signal 62.

Figure 4:
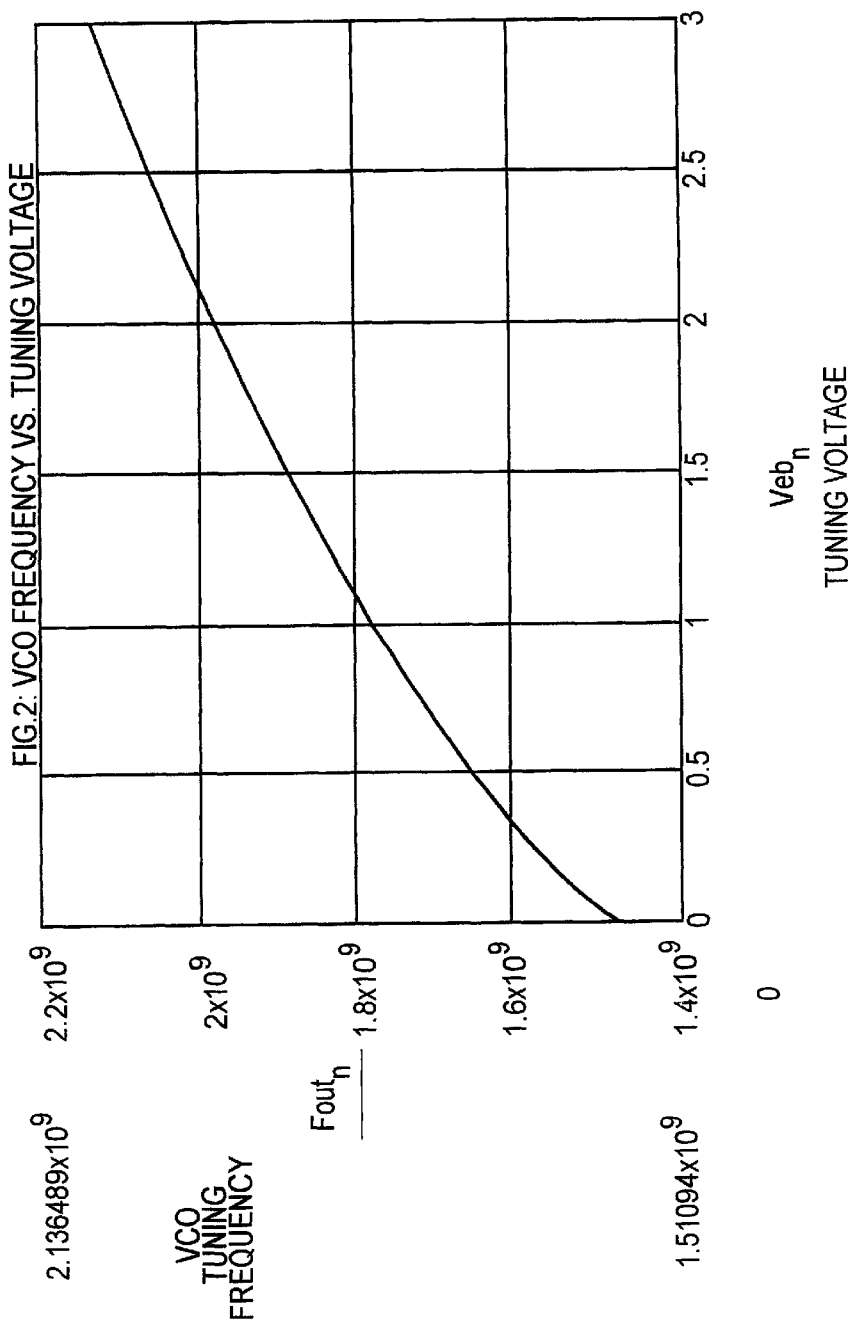
FIG. 4 is a tuning sensitivity curve for an exemplary VCO of the system of FIG. 2.

FIG. 4 depicts a tuning sensitivity curve for an exemplary VCO 44. As may be noted from FIG. 4, the tuning sensitivity is not constant across its tuning range (i.e., the tuning slope is not constant). As a result of the change in tuning sensitivity (slope) across the tuning range, a tuning voltage to the VCO 44 from the PLL loop 42 at lower frequencies cause greater frequency changes than at higher frequencies.

Since the tuning sensitivity is higher at the lower frequencies, prior art loop filters 48 have to be tuned at the lowest operating frequency to provide the greatest stability. Tuning the filter 48 at the lowest operating frequency to accommodate the non-linearities of the VCO 44 results in greater phase noise.

It has been found that the stability of the VCO system 12 may be considerably enhanced by adjusting a current gain $k_p$ of the charge pump 50 to compensate for any changes in the tuning sensitivity of the VCO 44. More specifically, the stability of the VCO system 12 can be increased by providing an nonlinear amplification function within the charge pump 50 that is equal and opposite to the nonlinearity of the tuning sensitivity curve of the VCO 44.

The determination of an appropriate nonlinear amplification factor for use within the charge pump 50 for any of a number of different operating points of the VCO 44 may be accomplished using any of a number of different methods. As a first step, it may be assumed that an equal and opposite reaction between tuning sensitivity and pumping amplification may be accomplished by setting the product of tuning sensitivity and pumping amplification equal to a constant (i.e., $k_V \times k_p$ constant).

Under a first method, a polynomial equation may be developed that predicts an output frequency for each incremental change in input voltage to the VCO 44. An inversion of this equation may be used to predict pumping amplification. Alternately, a lookup table 13 may be developed that relates a tuning voltage on an input 62 to the VCO 44 to a pumping amplification level. The lookup table 13 may be developed using either the equations discussed above or by using a calibration routine.

The VCO system 12 may be calibrated by choosing a tuning control word for the gain control processor 58 and stepping though a set of operating frequencies. The set of operating frequencies may be established by choosing a first tune control divisor and inputting the chosen value 66 from the tuning controller 14 into the divider 46. A phase difference may be measured at an output 68 of the phase detector 52. The chosen value 66 at the input to the divider 46 may be incremented by an integral value and the change at the output of the phase detector 68 measured using a meter 70. A difference between the measured value at the output 68 may be compared with a calculated change to arrive at a deviation value, which may then be stored in the gain controller 58. This process may be repeated over the operating range of the VCO system 12 to provide a deviation table. An amplification value may then be easily chosen to accommodate each deviation value within the deviation table. The deviation table and chosen amplification may together form the lookup table 13.

The use of the single chip VCO system 12 and gain control within the charge pump 50 for control the VCO system 12 offers a number of advantages over prior approaches. For example, adjustment of charge pump current gain to compensate for changes in tuning linearity allows an operating point of the PLL 42 to be centered for maximum stability. The construction of the VCO system 12 on a single chip improves kick and pull performance with regard to power supply fluctuations and parasitic loading effects.

While various embodiments of the application have been described, it will be apparent to those of ordinary skill in the art that many more embodiments and implementation are possible that are within the scope of this invention. Accordingly, the invention is not to be restricted except in light of the attached claims and their equivalents.

What is claimed is:

1. A method of controlling an output frequency of a voltage controlled oscillator relative to a reference frequency, comprising of:

detecting a phase error between a divided output of the voltage controlled oscillator and the reference frequency;

pumping a frequency control input of the voltage controlled oscillator based upon the phase error;

converting a magnitude of the frequency control input to the voltage controlled oscillator to a digital control word; and adjusting a pumping gain based upon the digital control word to thereby control an operating point of the voltage controlled oscillator.

2. The method of claim 1 further comprising entering a lookup table of pumping gain values using the converted frequency control input to the voltage controlled oscillator and recovering a pumping gain control word.

3. The method of claim 2 further comprising selectively activating and deactivating a set of pumping drive transistors based upon a value of the pumping gain control word.

4. A method of controlling an output frequency of a voltage controlled oscillator relative to a reference frequency, comprising of:

detecting a phase error between a divided output of the voltage controlled oscillator and the reference frequency;

pumping a frequency control input of the voltage controlled oscillator based upon the phase error;

determining a transfer function for the voltage controlled oscillator at a plurality of operating points; and adjusting a pumping gain based upon the magnitude of the frequency control input to the voltage controlled oscillator and the transfer function.

5. The method of claim 4 further comprising determining a pumping gain at each of the plurality of operating points such that a product of the pumping gain and transfer function is substantially a constant across the plurality of operating points.

6. The method of claim 5 further comprising storing the determined pumping gain in a lookup table.

7. An apparatus for controlling an output frequency of a voltage controlled oscillator relative to a reference frequency, comprising:

means for detecting a phase error between a divided output of the voltage controlled oscillator and the reference frequency;

means for pumping a frequency control input of the voltage controlled oscillator with the phase error;

means for converting the magnitude of the frequency control input to the voltage controlled oscillator to a digital control word; and means for adjusting a pumping gain based upon the digital control word to thereby control an operating point of the voltage controlled oscillator.

8. The apparatus of claim 7 further comprising means for entering a lookup table of pumping gain values using the converted frequency control input to the voltage controlled oscillator and recovering a pumping gain control word.

9. The apparatus of claim 8 further comprising means for selectively activating and deactivating a set of pumping drive transistors based upon a value of the pumping gain control word.

10. An apparatus for controlling an output frequency of a voltage controlled oscillator relative to a reference frequency, comprising:

means for detecting a phase error between a divided output of the voltage controlled oscillator and the reference frequency;

means for pumping a frequency control input of the voltage controlled oscillator with the phase error;

means for determining a transfer function for the voltage controlled oscillator at a plurality of operating points; and means for adjusting a pumping gain based upon a magnitude of the frequency control input to the voltage controlled oscillator and the transfer function.

11. The apparatus of claim 10 further comprising means for determining a pumping gain at each of the plurality of operating points such that a product of the pumping gain and transfer function is substantially a constant across the plurality of operating points.

12. The apparatus of claim 11 further comprising means for storing the determined pumping gain in a lookup table.

13. An apparatus for controlling an output frequency of a voltage controlled oscillator relative to a reference frequency, comprising:

a phase detector adapted to detect a phase error between a divided output of the voltage controlled oscillator and the reference frequency;

a charge pump adapted to pump a frequency control input of the voltage controlled oscillator with the phase error;

an analog to digital converter adapted to convert the magnitude of the frequency control input to the voltage controlled oscillator to a digital control word; and a gain controller adapted to adjust a pumping gain based upon the digital control word to thereby control an operating point of the voltage controlled oscillator.

14. The apparatus of claim 13 further comprising a lookup table of pumping gain values adapted to accept the converted frequency control input to the voltage controlled oscillator and to recover a pumping gain control word.

15. The apparatus of claim 14 further comprising a set of switches adapted to selectively activate and deactivate a set of pumping drive transistors based upon a value of the pumping gain control word.

16. An apparatus for controlling an output frequency of a voltage controlled oscillator relative to a reference frequency, comprising:

a phase detector adapted to detect a phase error between a divided output of the voltage controlled oscillator and the reference frequency;

a charge pump adapted to pump a frequency control input of the voltage controlled oscillator with the phase error;

a gain controller adapted to adjust a pumping gain based upon a magnitude of the frequency control input to the voltage controlled oscillator; and a meter that, together with the gain controller, is adapted to determine a transfer function for the voltage controlled oscillator at a plurality of operating points.

* * * * *